(12) United States Patent
Huang et al.

(10) Patent No.: US 9,620,553 B2
(45) Date of Patent: Apr. 11, 2017

(54) CMOS IMAGE SENSOR STRUCTURE WITH CROSSTALK IMPROVEMENT

(71) Applicant: TAIWAN SEMICONDUCTOR MANUFACTURING CO., LTD., Hsinchu (TW)

(72) Inventors: Chien-Chang Huang, Tainan (TW); Hsing-Chih Lin, Tainan (TW); Chien-Nan Tu, Kaohsiung (TW); Yu-Lung Yeh, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/183,595

(22) Filed: Jun. 15, 2016

(65) Prior Publication Data

US 2016/0300877 A1 Oct. 13, 2016

Related U.S. Application Data

(62) Division of application No. 14/583,406, filed on Dec. 26, 2014, now Pat. No. 9,397,130.

(51) Int. Cl.
*H01L 27/146* (2006.01)

(52) U.S. Cl.
CPC .... *H01L 27/14643* (2013.01); *H01L 27/1462* (2013.01); *H01L 27/1463* (2013.01); *H01L 27/14623* (2013.01); *H01L 27/14627* (2013.01); *H01L 27/14629* (2013.01); *H01L 27/14685* (2013.01); *H01L 27/14687* (2013.01); *H01L 27/14689* (2013.01); *H01L 27/1464* (2013.01)

(58) Field of Classification Search
CPC ......... H01L 27/14643; H01L 27/14689; H01L 27/14629; H01L 27/14687
USPC ....................................................... 257/435
See application file for complete search history.

(56) References Cited

U.S. PATENT DOCUMENTS

| | | | |
|---|---|---|---|
| 2010/0006969 A1 | 1/2010 | Park et al. |
| 2011/0001038 A1 | 1/2011 | Tseng et al. |
| 2015/0187827 A1 | 7/2015 | Tu et al. |
| 2015/0279885 A1 | 10/2015 | Tu et al. |

*Primary Examiner* — Anthony Ho
(74) *Attorney, Agent, or Firm* — Maschoff Brennan

(57) ABSTRACT

A semiconductor device includes a substrate, a semiconductor layer, light-sensing devices, a transparent dielectric layer and a grid shielding layer. The semiconductor layer overlies the substrate, and has a first surface and a second surface opposite to the first surface. The semiconductor layer includes microstructures disposed on the second surface of the semiconductor layer. The light-sensing devices are disposed on the first surface of the semiconductor layer. The transparent dielectric layer is disposed on the second surface of the semiconductor layer, and covers the microstructures. The grid shielding layer extends from the first surface of the semiconductor layer toward the second surface of the semiconductor layer, and surrounds each of the light-sensing devices to separate the light-sensing devices from each other, in which a depth of the grid shielding layer is greater than two-thirds of a thickness of the semiconductor layer.

20 Claims, 10 Drawing Sheets

CMOS IMAGE SENSOR STRUCTURE WITH CROSSTALK IMPROVEMENT

PRIORITY CLAIM AND CROSS-REFERENCE

This is a divisional application of U.S. patent application Ser. No. 14/583,406 filed on Dec. 26, 2014, which is incorporated herein by reference in its entirety.

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Front side illuminated (FSI) CMOS image sensors and back side illuminated (BSI) CMOS image sensors are two types of CMOS image sensors. The FSI CMOS image sensors are operable to detect light projected from their front side while the BSI CMOS image sensors are operable to detect light projected from their backside. When light projected into the FSI CMOS image sensors or the BSI CMOS image sensors, photoelectrons are generated and then are sensed by light-sensing devices in pixels of the image sensors. The more the photoelectrons are generated, the more superior quantum efficiency (QE) the image sensor has, thus improving the image quality of the CMOS image sensors.

However, while CMOS image sensor technologies are rapidly developed, CMOS image sensors with higher quantum efficiency are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
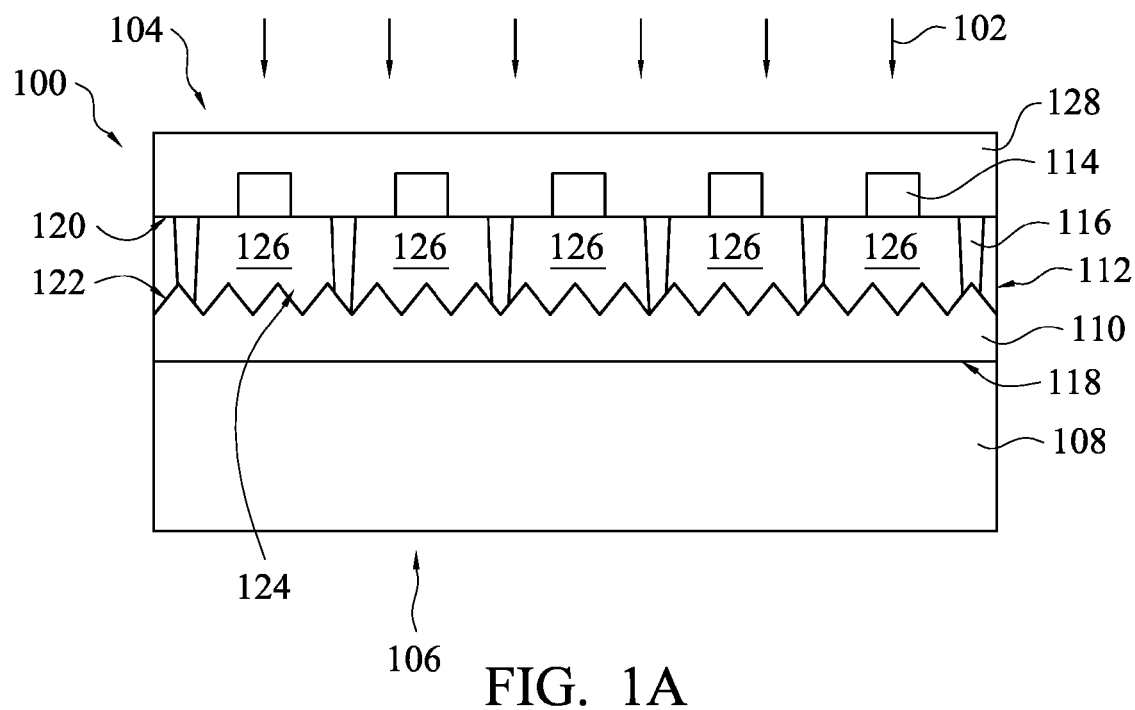
FIG. 1A is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical CMOS image sensor, various microstructures are formed on a surface of a semiconductor layer, and are closely adjacent to a transparent dielectric layer for increasing light absorption of the semiconductor layer, thus increasing photoelectrons generated in the semiconductor layer via multiple reflections and/or refractions of light. Accordingly, a quantum efficiency of the CMOS image sensor is increased. However, the light and the photoelectrons may be diffused to adjoining pixels due to the multiple reflections and/or the refractions of the light, thereby increasing crosstalk effects of the CMOS image sensor.

Embodiments of the present disclosure are directed to providing a semiconductor device and a method for manufacturing the semiconductor device, in which a grid shielding layer is disposed in a semiconductor layer to define the semiconductor layer into various pixel regions and to separate the pixel regions from each other, so that photoelectrons and reflected light and/or refracted light from the semiconductor layer can be blocked within any one of the pixel regions by the grid shielding layer. Accordingly, a crosstalk effect of the semiconductor device can be significantly improved.

FIG. 1A is schematic cross-sectional view of a semiconductor device in accordance with various embodiments. In some embodiments, a semiconductor device 100 is a CMOS image sensor device, which may be operated for sensing incident light 102. The semiconductor device 100 has a front side 104 and a back side 106. In some embodiments, the semiconductor device 100 is a FSI CMOS image sensor device, which is operated to sense the incident light 102 projected from its front side 104. As shown in FIG. 1A, the semiconductor device 100 includes a substrate 108, a transparent dielectric layer 110, a semiconductor layer 112, various light-sensing devices 114 and a grid shielding layer 116. The substrate 108 is a semiconductor substrate. The substrate 108 is composed of a single-crystalline semiconductor material or a compound semiconductor material. For example, the substrate 108 is a silicon substrate. In some examples, germanium or glass may also be used as a material of the substrate 108.

The semiconductor layer 112 is disposed over the substrate 108. In some examples, the semiconductor layer 112 is formed from epitaxial silicon and/or epitaxial germanium. The semiconductor layer 112 has a first surface 120 and a second surface 122, which are located on two opposite sides of the semiconductor layer 112. In some examples, a thickness of the semiconductor layer 112 ranges from 0.1 micrometers to 20 micrometers. The semiconductor layer 112 includes various microstructures 124 formed on the second surface 122. In some examples, each microstructure 124 has a cross-section in a shape of triangle, trapezoid or arc such as semi-circle or semi-ellipse. The microstructures 124 may be periodically arranged or unperiodically arranged. In addition, any two adjacent microstructures 124 may adjoin to each other, or may be separated from each other.

The transparent dielectric layer 110 is disposed on the second surface 122 of the semiconductor layer 112 and covers the microstructures 124. In some embodiments, as shown in FIG. 1A, the transparent dielectric layer 110 is located on a surface 118 of the substrate 108 and between the substrate 108 and the semiconductor layer 112. In some examples, a refractive index of the semiconductor layer 112 is greater than that of the transparent dielectric layer 110. For example, the transparent dielectric layer 110 is formed from silicon dioxide, silicon nitride or silicon oxynitride while the semiconductor layer 112 is formed from epitaxial silicon.

By forming the microstructures 124 on the second surface 122 of the semiconductor layer 112 and forming the transparent dielectric layer 110 with a refractive index smaller than that of the semiconductor layer 112, a total reflection angle of the incident light 102 emitted from the semiconductor layer 112 to the transparent dielectric layer 110 is relatively small, so that some of the incident light 102 can be reflected back to the semiconductor layer 112, thereby increasing an amount of photoelectrons generated by the semiconductor layer 112. Hence, a quantum efficiency of the semiconductor device 100 is increased.

Figure 1B:
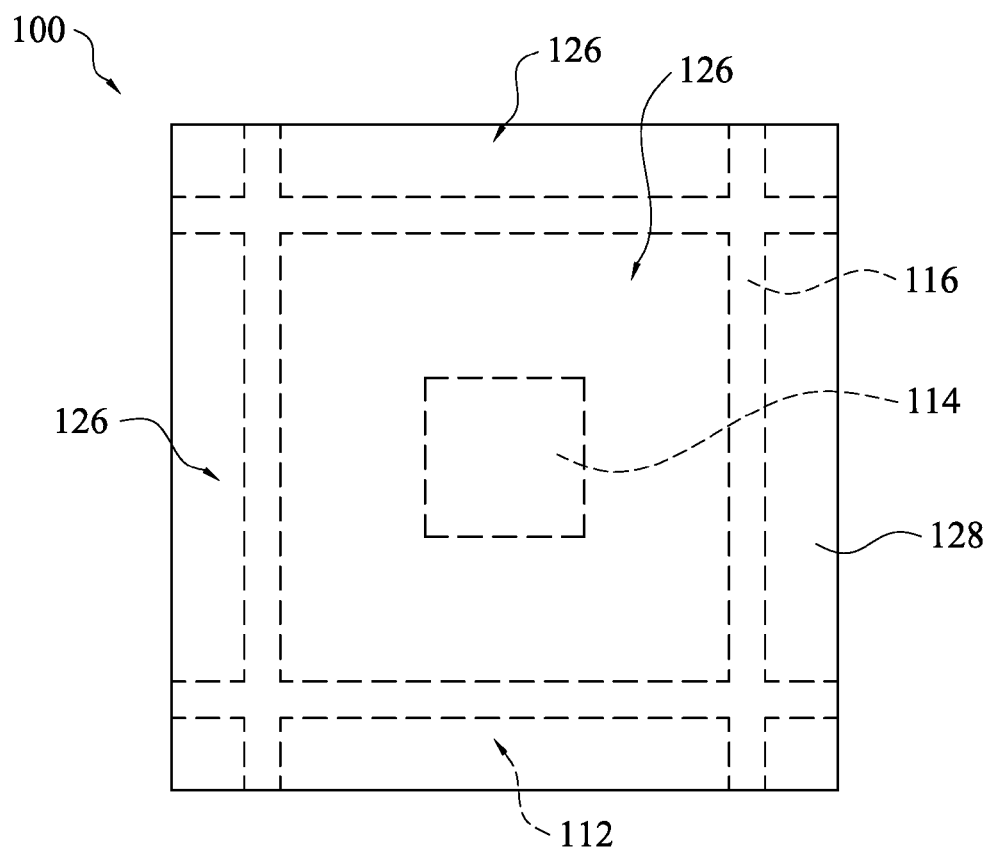
FIG. 1B is a schematic top view of a semiconductor device in accordance with various embodiments.

Simultaneously referring to FIG. 1A and FIG. 1B, FIG. 1B is a schematic top view of a semiconductor device in accordance with various embodiments. As shown in FIG. 1A, the grid shielding layer 116 is disposed in the semiconductor layer 112 and extends from the first surface 120 toward the second surface 122 of the semiconductor layer 112. As shown in FIG. 1B, the grid shielding layer 116 defines the semiconductor layer 112 into various pixel regions 126, and surrounds each of the pixel regions 126 to separate the pixel regions 126 from each other. In some examples, a depth of the grid shielding layer 116 is greater than two-thirds of the thickness of the semiconductor layer 112. In certain examples, the grid shielding layer 116 penetrates through the semiconductor layer 112, i.e. the grid shielding layer 116 extends from the first surface 120 to the second surface 122 of the semiconductor layer 112, and the depth of the grid shielding layer 116 is equal to the thickness of the semiconductor layer 112. In some examples, the grid shielding layer 116 is formed from an electrically insulating material. In addition, a refractive index of the semiconductor layer 112 is greater than that of the grid shielding layer 116. For example, the grid shielding layer 116 is formed from silicon dioxide, silicon nitride or silicon oxynitride while the semiconductor layer 112 is formed from epitaxial silicon.

By forming the grid shielding layer 116 with a refractive index smaller than that of the semiconductor layer 112, a total reflection angle of the incident light 102 projected from the semiconductor layer 112 to the grid shielding layer 116 is relatively small, so that most of the incident light 102 can be reflected back to the semiconductor layer 112, thereby increasing an amount of photoelectrons generated by the semiconductor layer 112 and significantly blocking the incident light 102 reflected and/or refracted by any one of the pixel regions from entering the adjoining pixel regions 126. Hence, a quantum efficiency of the semiconductor device 100 is increased and a crosstalk effect of the semiconductor device 100 is improved. Moreover, by forming the grid shielding layer 116 from an electrically insulating material, photoelectrons generated in any one of the pixel regions 126 can be blocked by the grid shielding layer 116 from entering the adjoining pixel regions 126. Accordingly, the crosstalk effect of the semiconductor device 100 can be further improved.

The light-sensing devices 114 are operated to sense the incident light 102. Referring to FIG. 1A again, the light-sensing devices 114 are disposed on the first surface 120 of the semiconductor layer 112 and are respectively located in the pixel regions 126. Hence, the grid shielding layer 116 surrounds each of the light-sensing devices 114 respectively located in the pixel regions 126, so as to separate the light-sensing devices 114 from each other. In some examples, each light-sensing device 114 includes an image sensor element, in which the image sensor element includes a photodiode and other elements.

In some examples, the semiconductor device 100 may optionally include a passivation layer 128 disposed on the first surface 120 of the semiconductor layer 112, the passivation layer 128 covering the light-sensing devices 114, the grid shielding layer 116 and the first surface 120 of the semiconductor layer 112. The passivation layer 128 is suitable for use in protecting the light-sensing devices 114, the grid shielding layer 116 and the semiconductor layer 112 from being damaged. The passivation layer 128 may be formed from silicon oxide, silicon nitride or silicon oxynitride.

Figure 2A:
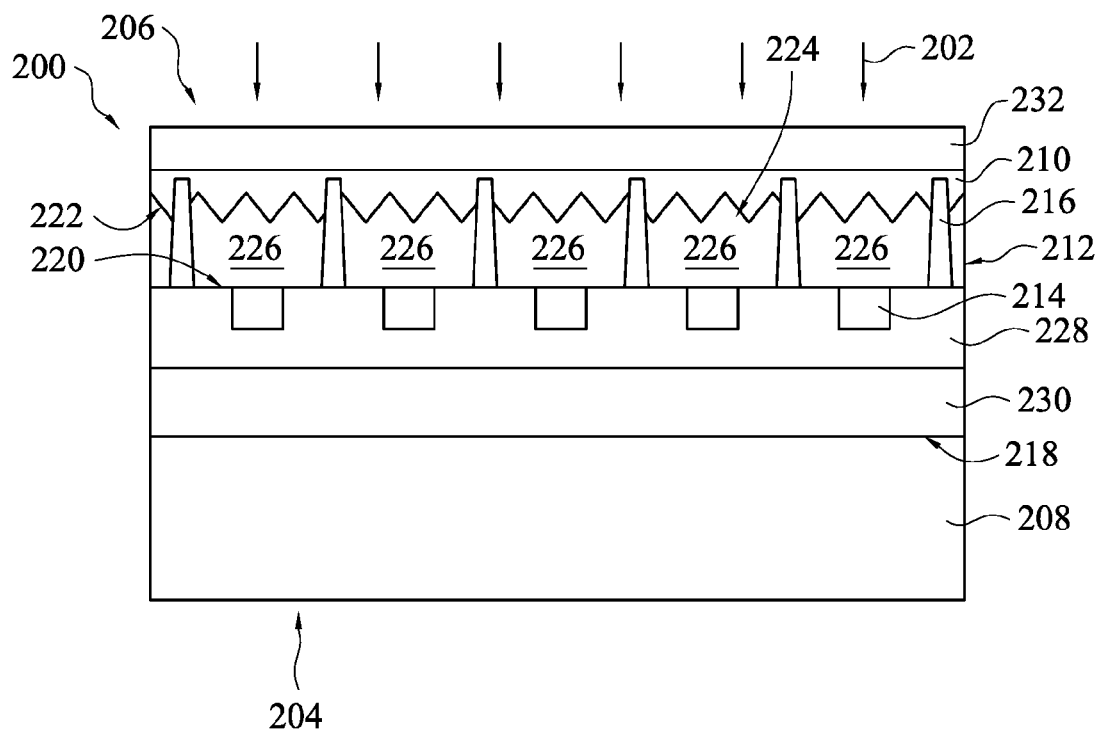
FIG. 2A is a schematic cross-sectional view of a semiconductor device in accordance with various embodiments.

FIG. 2A is schematic cross-sectional view of a semiconductor device in accordance with various embodiments. In some embodiments, a semiconductor device 200 is a CMOS image sensor device, which may be operated for sensing incident light 202. The semiconductor device 200 has a front side 204 and a back side 206. In some embodiments, the semiconductor device 200 is a BSI CMOS image sensor device, which is operated to sense the incident light 202 projected from its back side 206. As shown in FIG. 2A, the semiconductor device 200 includes a substrate 208, a semiconductor layer 212, a transparent dielectric layer 210, various light-sensing devices 214 and a grid shielding layer 216. The substrate 208 is a semiconductor substrate. The substrate 208 is composed of a single-crystalline semiconductor material or a compound semiconductor material. In some examples, the substrate 208 is a silicon substrate. In some embodiments, germanium or glass may also be used as a material of the substrate 208.

The semiconductor layer 212 is disposed over a surface 218 of the substrate 208. In some examples, the semiconductor layer 212 is formed from epitaxial silicon and/or epitaxial germanium. The semiconductor layer 212 has a first surface 220 and a second surface 222 opposite to the first surface 220. In some examples, a thickness of the semiconductor layer 212 ranges from 0.1 micrometers to 20 micrometers. The semiconductor layer 212 includes various microstructures 224 formed on the second surface 222. In some examples, each microstructure 224 has a cross-section in a shape of triangle, trapezoid or arc such as semi-circle or semi-ellipse. The microstructures 224 may be periodically arranged or unperiodically arranged. In addition, any two adjacent microstructures 224 may adjoin to each other, or may be separated from each other.

The transparent dielectric layer 210 is disposed on the second surface 222 of the semiconductor layer 212 and covers the microstructures 224. In some embodiments, as shown in FIG. 2A, the semiconductor layer 212 is located between the substrate 208 and the transparent dielectric layer 210. In some examples, a refractive index of the semiconductor layer 212 is greater than that of the transparent dielectric layer 210. In some exemplary examples, the transparent dielectric layer 210 is formed from silicon dioxide, silicon nitride or silicon oxynitride while the semiconductor layer 212 is formed from epitaxial silicon.

With the microstructures 224 formed on the second surface 222 of the semiconductor layer 212 and the transparent dielectric layer 210 with a refractive index smaller than that of the semiconductor layer 212 covering the microstructures 224 of the semiconductor layer 212, an area of the second surface 222 is increased, and an incident angle of the incident light 202 projected to the second surface 222 is smaller than that of the incident light 222 projected to a planar surface, so that most of the incident light 202 can be multiply refracted and reflected in the microstructures 224, thereby increasing an amount of photoelectrons generated by the semiconductor layer 212. Hence, a quantum efficiency of the semiconductor device 200 is increased.

Figure 2B:
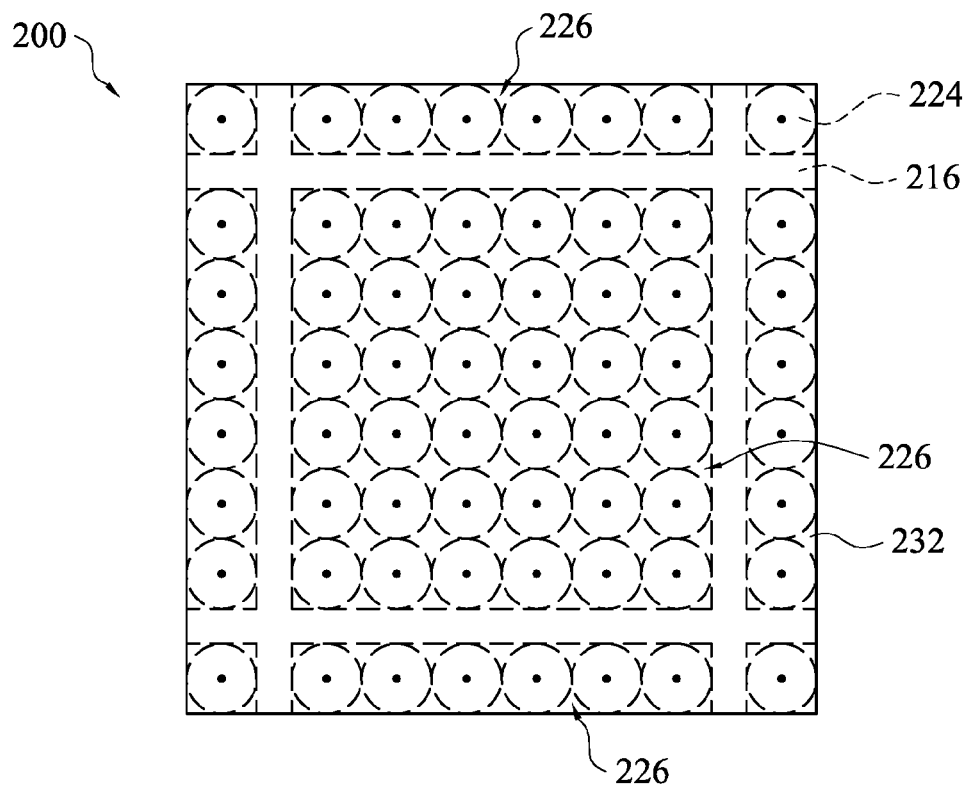
FIG. 2B is a schematic top view of a semiconductor device in accordance with various embodiments.

Simultaneously referring to FIG. 2A and FIG. 2B, FIG. 2B is a schematic top view of a semiconductor device in accordance with various embodiments. As shown in FIG. 2A, the grid shielding layer 216 is disposed in the semiconductor layer 212 and extends from the first surface 220 toward the second surface 222 of the semiconductor layer 212. As shown in FIG. 2A and FIG. 2B, the grid shielding layer 216 defines the semiconductor layer 212 into various pixel regions 226, and surrounds each of the pixel regions 226 to separate the pixel regions 226 from each other. In some examples, a depth of the grid shielding layer 216 is greater than two-thirds of the thickness of the semiconductor layer 212. In certain examples, the grid shielding layer 216 penetrates through the semiconductor layer 212, i.e. the grid shielding layer 216 extends from the first surface 220 to the second surface 222 of the semiconductor layer 212, and the depth of the grid shielding layer 216 is equal to the thickness of the semiconductor layer 212. In some examples, the grid shielding layer 216 is formed from an electrically insulating material. In addition, a refractive index of the grid shielding layer 216 is smaller than that of the semiconductor layer 212. In some exemplary examples, the grid shielding layer 216 is formed from silicon dioxide, silicon nitride or silicon oxynitride while the semiconductor layer 212 is formed from epitaxial silicon.

By forming the grid shielding layer 216 with a refractive index smaller than that of the semiconductor layer 212, a total reflection angle of the incident light 202 from the semiconductor layer 212 to the grid shielding layer 216 is relatively small, so that most of the incident light 202 can be reflected back to the semiconductor layer 212, thereby significantly blocking the incident light 202 reflected and/or refracted by any one of the pixel regions from entering the adjoining pixel regions 226, thus increasing an amount of photoelectrons generated by the semiconductor layer 212. Therefore, a crosstalk effect of the semiconductor device 200 is improved and a quantum efficiency of the semiconductor device 200 is increased. Furthermore, by forming the grid shielding layer 216 from an electrically insulating material, photoelectrons generated in any one of the pixel regions 226 can be blocked by the grid shielding layer 216 from diffusing to the adjoining pixel regions 226. Accordingly, the crosstalk effect of the semiconductor device 200 can be further improved.

The light-sensing devices 214 are operated to sense the incident light 202. Referring to FIG. 2A again, the light-sensing devices 214 are disposed on the first surface 220 of the semiconductor layer 212 and respectively located in the pixel regions 226. Thus, the grid shielding layer 216 surrounds each of the light-sensing devices 214 respectively located in the pixel regions 226, so as to separate the light-sensing devices 214 from each other. In some examples, each light-sensing device 214 includes an image sensor element, in which the image sensor element includes a photodiode and other elements.

Referring to FIG. 2A again, in some examples, the semiconductor device 200 may optionally include a passivation layer 232 disposed on the transparent dielectric layer 210 and covering the microstructures 224, in which the passivation layer 232 and the semiconductor layer 212 are disposed on opposite sides of the transparent dielectric layer 210. The passivation layer 232 is suitable for protecting the transparent dielectric layer 210 and the microstructures 224 underlying the transparent dielectric layer 210 from being damaged. The passivation layer 232 may be formed from silicon oxide, silicon nitride or silicon oxynitride.

In some examples, as shown in FIG. 2A, the semiconductor device 200 may optionally include another passivation layer 228 disposed on the first surface 220 of the semiconductor layer 212, the passivation layer 228 covering the light-sensing devices 214, the grid shielding layer 216 and the first surface 220 of the semiconductor layer 212. The passivation layer 228 is suitable for protecting the light-sensing devices 214, the grid shielding layer 216 and the semiconductor layer 212 from being damaged. The passivation layer 228 may be formed from silicon oxide, silicon nitride or silicon oxynitride. Referring to FIG. 2A again, in certain examples, the semiconductor device 200 may optionally include a bonding layer 230 disposed between the surface 218 of the substrate 208 and the passivation layer 228 for bonding the substrate 208 to the passivation layer 228. For example, the bonding layer 230 may be formed from silicon dioxide.

Figure 3A:
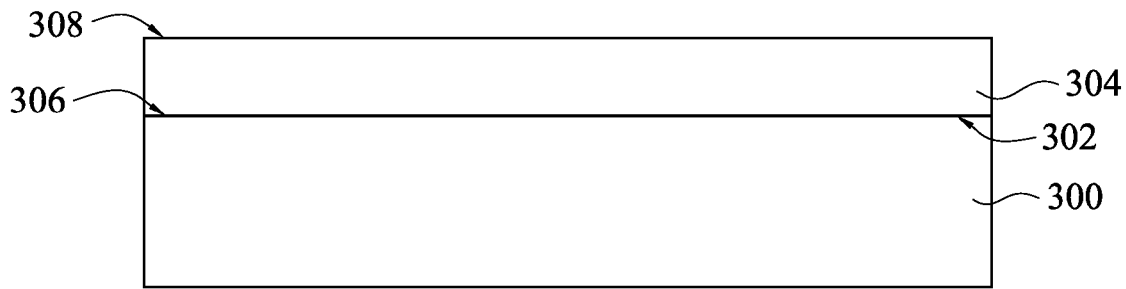
FIG. 3A through FIG. 3G are schematic cross-sectional views of intermediate stages showing a method for manufacturing a semiconductor device in accordance with various embodiments.

Referring to FIG. 3A through FIG. 3G, FIG. 3A through FIG. 3G are schematic cross-sectional views of intermediate stages showing a method for manufacturing a semiconductor device in accordance with various embodiments. As shown in FIG. 3A, a substrate 300 is provided. The substrate 300 is a semiconductor substrate and may be composed of a single-crystalline semiconductor material or a compound semiconductor material. In some examples, silicon, germanium or glass may be used as a material of the substrate 300. A semiconductor layer 304 is formed on a surface 302 of the substrate 300 by using, for example, a deposition technique or an epitaxial technique. In some examples, the operation of providing the substrate 300 includes forming the semiconductor layer 304 from epitaxial silicon and/or epitaxial germanium. The semiconductor layer 304 has a first surface 306 and a second surface 308 opposite to the first surface 306. In some examples, a thickness of the semiconductor layer 304 ranges from 0.1 micrometers to 20 micrometers.

Figure 3B:
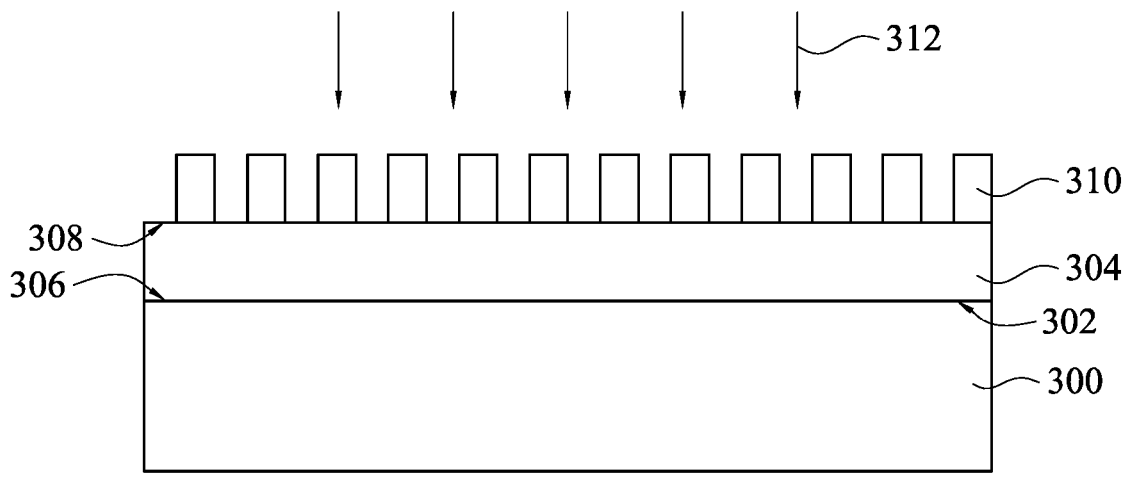
Figure 3C:
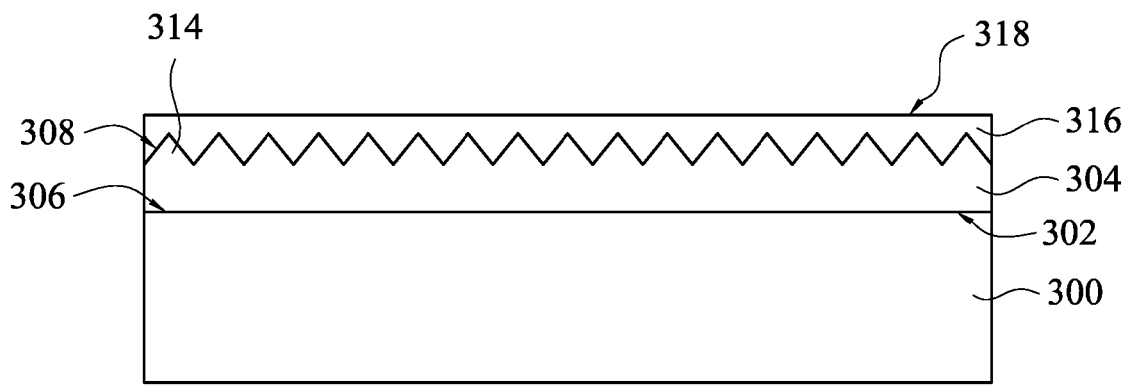

As shown in FIG. 3B and FIG. 3C, various microstructures 314 are formed on the second surface 308 of the semiconductor layer 304. In some examples, the operation of forming the microstructures 314 is performed using a photolithography process and an etching process. The photolithography process is performed to define regions where the microstructures 314 are formed, and the etching process is performed on the second surface 308 to remove a portion of the semiconductor layer 304, so as to form the microstructures 314 on the second surface 308 according to the definition of the photolithography process. In the photolithography process, a mask layer 310 is formed on the second surface 308 of the semiconductor layer 304 by using, for example, a spin coating method. The mask layer 310 may be formed from a photo-resist material. An exposure operation and a development operation are subsequently performed on the mask layer 310 to pattern the mask layer 310. As shown in FIG. 3B, after patterning, the mask layer 310 exposes a portion of the second surface 308 of the semiconductor layer 304. An etching operation 312, such as a dry etching operation and a wet etching operation, is performed on the second surface 308 exposed by the mask layer 310 to form the microstructures 314 on the second surface 308 of the semiconductor layer 304, as shown in FIG. 3C. For example, the etching operation 312 is performed using plasma. The mask layer 310 is removed from the second surface 310 after the etching operation 312 is completed. In some examples, each microstructure 314 is formed with a cross-section in a shape of triangle, trapezoid or arc such as semi-circle or semi-ellipse. The microstructures 314 may be formed periodically or unperiodically. In addition, the operation of forming the microstructures 314 may be performed to form any two adjacent microstructures 314 adjoining to each other or being separated from each other.

As shown in FIG. 3C, a transparent dielectric layer 316 is formed on the second surface 308 of the semiconductor layer 304 and covering the microstructures 314. In some examples, in the operation of forming the transparent dielectric layer 316, the transparent dielectric layer 316 is firstly formed to cover the microstructures 314, and then a planarization operation is performed on the transparent dielectric layer 314 to planarize a surface 318 of the transparent dielectric layer 316. Thus, the surface 318 of the transparent dielectric layer 316 is planar after the planarization operation. In some exemplary examples, the operation of forming the transparent dielectric layer 316 is performed using a thermal oxidation technique or a chemical vapor deposition (CVD) technique. In addition, the planarization operation is performed using a chemical mechanical polishing (CMP) technique. In some examples, the operation of forming the transparent dielectric layer 316 includes forming the transparent dielectric layer 316 using a material having a refractive index which is smaller than a refractive index of the semiconductor layer 304. For example, the operation of forming the transparent dielectric layer 316 includes forming the transparent dielectric layer 316 from silicon dioxide, silicon nitride or silicon oxynitride while the operation of the semiconductor layer 304 includes forming the semiconductor layer 304 from epitaxial silicon.

Figure 3D:
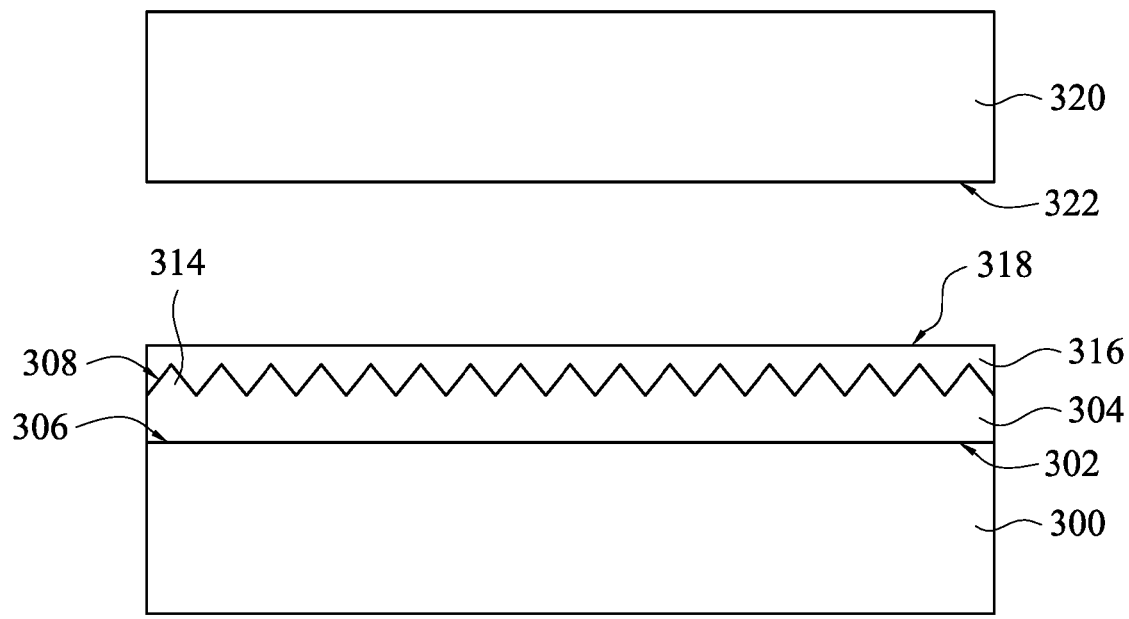

As shown in FIG. 3D, another substrate 320 is provided and then is bonded to the surface 318 of the transparent dielectric layer 316. Because the surface 318 of the transparent dielectric layer 316 is planarized, the substrate 320 can be successfully bonded to the transparent dielectric layer 316. In some examples, the substrate 320 is a semiconductor substrate and may be composed of a single-crystalline semiconductor material or a compound semiconductor material. In some examples, silicon, germanium or glass may be used as a material of the substrate 320.

Figure 3E:
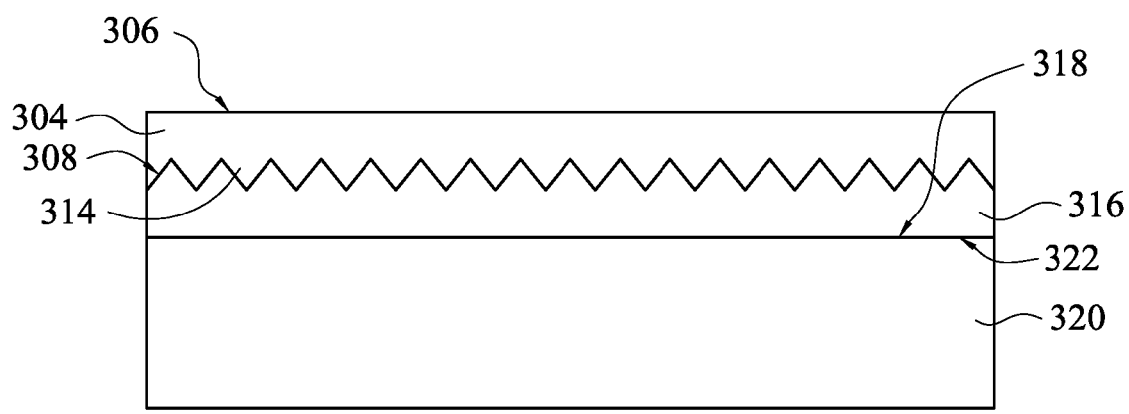

As shown in FIG. 3E, the structure composed of the substrate 300, the semiconductor layer 304, the transparent dielectric layer 316 and the substrate 320 is reversed, and the substrate 300 is removed to expose the first surface 306 of the semiconductor layer 304. In some examples, the operation of removing the substrate 300 is performed using a thinning technique, such as a wet etching technique and a CMP technique.

Figure 3F:
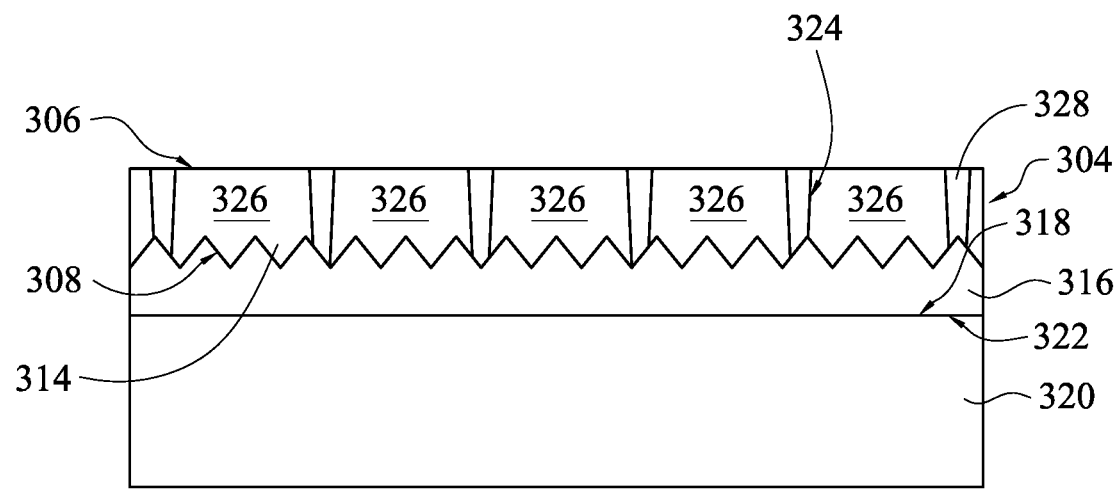

As shown in FIG. 3F, a grid shielding layer 328 is formed in the semiconductor layer 304 and extends from the first surface 306 toward the second surface 308 of the semiconductor layer 304, so as to define the semiconductor layer 304 into various pixel regions 326. The grid shielding layer 328 surrounds each of the pixel regions 326 to separate the pixel regions 326 from each other. In some examples, a depth of the grid shielding layer 328 is greater than two-thirds of the thickness of the semiconductor layer 304. In certain examples, the grid shielding layer 328 penetrates through the semiconductor layer 304, i.e. the grid shielding layer 328 extends from the first surface 306 to the second surface 308 of the semiconductor layer 304, and the depth of the grid shielding layer 328 is equal to the thickness of the semiconductor layer 304. In some examples, in the operation of forming the grid shielding layer 328, a trench 324 is formed in the semiconductor layer 304 using, for example, a photolithography process and an etching process. The trench 324 is formed to extend from the first surface 306 toward the second surface 308, so as to form the pixel regions 326 in the semiconductor layer 304. The operation of forming the trench 324 includes forming the trench 324 surrounding each of the pixel regions 326 and separating the pixel regions 326 from each other. In some examples, after the trench 324 is formed, the grid shielding layer 328 is formed to fill into the trench 324 by using a deposition technique, such as a CVD technique. A removal operation may be optionally performed to remove an excess portion of the grid shielding layer 328 on the first surface 306 of the semiconductor layer 304.

In some examples, the grid shielding layer 328 is formed from an electrically insulating material. In addition, the operation of forming the grid shielding layer 328 is performed to form the grid shielding layer 328 using a material having a refractive index which is smaller than that of the semiconductor layer 304. In some exemplary examples, the grid shielding layer 328 is formed from silicon dioxide, silicon nitride or silicon oxynitride while the semiconductor layer 304 is formed from epitaxial silicon.

Figure 3G:
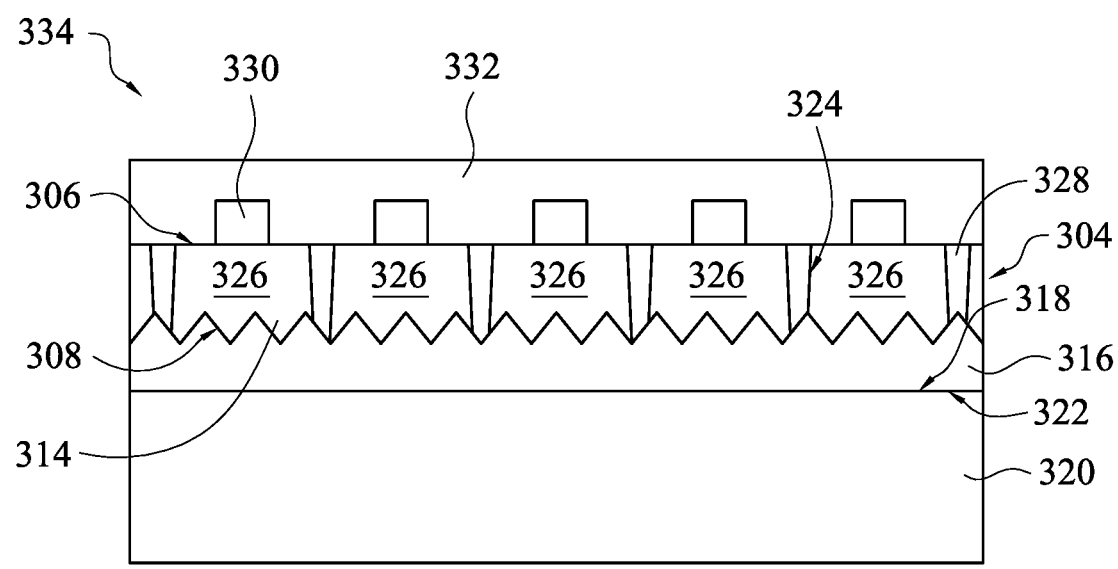

As shown in FIG. 3G, various light-sensing devices 330 are formed on the first surface 306 of the semiconductor layer 304 and are respectively disposed in the pixel regions 326 to complete a semiconductor device 334. Thus, the grid shielding layer 328 separates the light-sensing devices 330 from each other. In some examples, each light-sensing device 330 includes an image sensor element, in which the image sensor element includes a photodiode and other elements.

In some examples, a passivation layer 332 may be optionally formed on the first surface 306 of the semiconductor layer 304 and covering the light-sensing devices 330, the grid shielding layer 328 and the first surface 306 of the semiconductor layer 304 for protecting the light-sensing devices 330, the grid shielding layer 328 and the semiconductor layer 304 from being damaged. The passivation layer 332 may be formed from silicon oxide, silicon nitride or silicon oxynitride.

Figure 4:
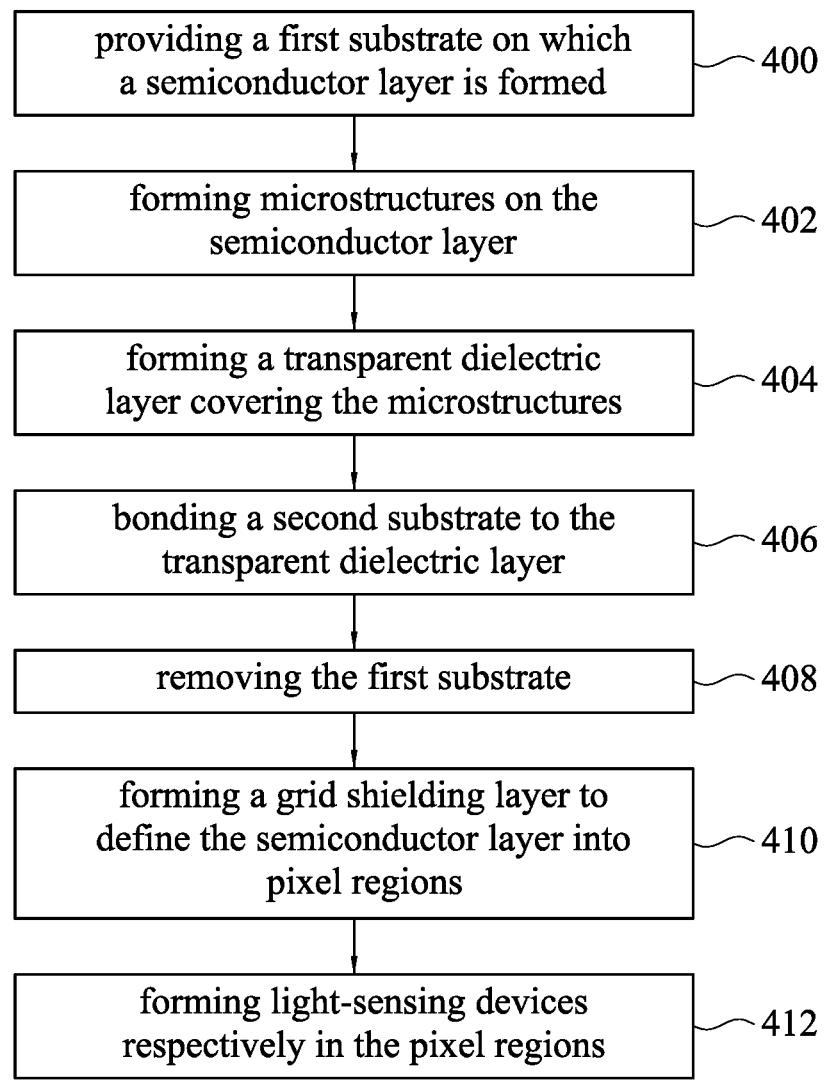
FIG. 4 is a flow chart of a method for manufacturing a semiconductor device in accordance with various embodiments.

Referring to FIG. 4 with FIG. 3A through FIG. 3G, FIG. 4 is a flow chart of a method for manufacturing a semiconductor device in accordance with various embodiments. The method begins at operation 400, where a substrate 300 is provided, and a semiconductor layer 304 is formed on a surface 302 of the substrate 300, as shown in FIG. 3A. The semiconductor layer 304 may be formed using, for example, a deposition technique or an epitaxial technique. The semiconductor layer 304 has a first surface 306 and a second surface 308 opposite to the first surface 306. In some examples, a thickness of the semiconductor layer 304 ranges from 0.1 micrometers to 20 micrometers.

At operation 402, as shown in FIG. 3B and FIG. 3C, various microstructures 314 are formed on the second surface 308 of the semiconductor layer 304 using, for example, a photolithography process and an etching process. In some examples, in the photolithography process, a mask layer 310 is formed on the second surface 308 of the semiconductor layer 304 by using a spin coating method. An exposure operation and a development operation are subsequently performed on the mask layer 310 to pattern the mask layer 310, as shown in FIG. 3B. An etching operation 312, such as a dry etching operation and a chemical etching operation, is performed on the second surface 308 exposed by the mask layer 310 to form the microstructures 314 on the second surface 308, as shown in FIG. 3C. The etching operation 312 may be performed using plasma. The operation of forming the microstructures 314 may be performed to form each microstructure 314 with a cross-section in a shape of triangle, trapezoid or arc such as semi-circle or semi-ellipse. The microstructures 314 may be formed periodically or unperiodically. In addition, the operation of forming the microstructures 314 may be performed to form any two adjacent microstructures 314 adjoining to each other or being separated from each other.

At operation 404, referring to FIG. 3C again, a transparent dielectric layer 316 is formed on the second surface 308 of the semiconductor layer 304 and covering the microstructures 314 using, for example, a thermal oxidation technique or a CVD technique. In some examples, a planarization operation may be optionally performed on the transparent dielectric layer 314 to planarize a surface 318 of the transparent dielectric layer 316. For example, the planarization operation is performed using a CMP technique. The operation of forming the transparent dielectric layer 316 includes forming the transparent dielectric layer 316 using a material having a refractive index which is smaller than a refractive index of the semiconductor layer 304. In some exemplary examples, the operation of forming the transparent dielectric layer 316 includes forming the transparent dielectric layer 316 from silicon dioxide, silicon nitride or silicon oxynitride.

At operation 406, as shown in FIG. 3D, another substrate 320 is provided and bonded to the surface 318 of the transparent dielectric layer 316. At operation 408, as shown in FIG. 3E, the structure composed of the substrate 300, the semiconductor layer 304, the transparent dielectric layer 316 and the substrate 320 is reversed, and the substrate 300 is removed to expose the first surface 306 of the semiconductor layer 304 using, for example, a thinning technique. In some examples, the operation of removing the substrate 300 is performed using a wet etching technique and a CMP technique.

At operation 410, as shown in FIG. 3F, a grid shielding layer 328 is formed in the semiconductor layer 304. In the operation of forming the grid shielding layer 328, a trench 324 is formed in the semiconductor layer 304 using, for example, a photolithography process and an etching process. The trench 324 is formed to extend from the first surface 306 toward the second surface 308 of the semiconductor layer 304, so as to define pixel regions 326 in the semiconductor layer 304. The operation of forming the trench 324 includes forming the trench 324 surrounding each of the pixel regions 326 and separating the pixel regions 326 from each other. Then, the grid shielding layer 328 is formed to fill into the trench 324 by using a deposition technique, such as a CVD technique. The trench 324 surrounds each of the pixel regions 326 and separates the pixel regions 326 from each other, so that the grid shielding layer 328 filling the trench 324 extends from the first surface 306 toward the second surface 308 and surrounds each of the pixel regions 326 to separate the pixel regions 326 from each other. In some examples, a depth of the grid shielding layer 328 is greater than two-thirds of the thickness of the semiconductor layer 304. In certain examples, the grid shielding layer 328 penetrates through the semiconductor layer 304, and the depth of the grid shielding layer 328 is equal to the thickness of the semiconductor layer 304. In some examples, a removal operation may be optionally performed to remove an excess portion of the grid shielding layer 328 on the first surface 306 of the semiconductor layer 304.

In some examples, the grid shielding layer 328 is formed from an electrically insulating material. In some exemplary examples, the grid shielding layer 328 is formed using a material having a refractive index which is smaller than that of the semiconductor layer 304. For example, the grid shielding layer 328 is formed from silicon dioxide, silicon nitride or silicon oxynitride.

At operation 412, as shown in FIG. 3G, various light-sensing devices 330 are formed on the first surface 306 of the semiconductor layer 304 and are respectively disposed in the pixel regions 326 to complete a semiconductor device 334. The grid shielding layer 328 separates the pixel regions 326, so that the grid shielding layer 328 separates the light-sensing devices 330 respectively in the pixel regions 326 from each other. In some examples, each light-sensing device 330 includes an image sensor element, in which the image sensor element includes a photodiode and other elements. Optionally, a passivation layer 332 may be formed on the first surface 306 of the semiconductor layer 304 and covering the light-sensing devices 330, the grid shielding layer 328 and the first surface 306 of the semiconductor layer 304 for protecting.

Figure 5A:
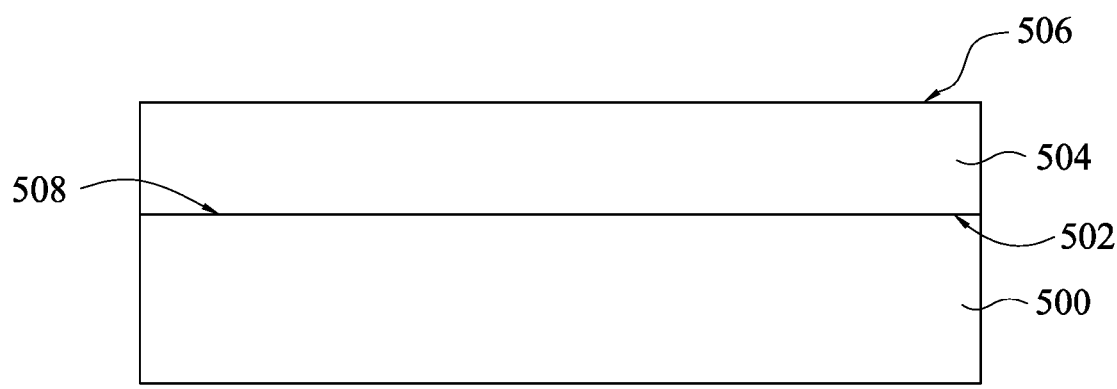
FIG. 5A through FIG. 5G are schematic cross-sectional views of intermediate stages showing a method for manufacturing a semiconductor device in accordance with various embodiments.

Referring to FIG. 5A through FIG. 5G, FIG. 5A through FIG. 5G are schematic cross-sectional views of intermediate stages showing a method for manufacturing a semiconductor device in accordance with various embodiments. As shown in FIG. 5A, a substrate 500 is provided. The substrate 500 is a semiconductor substrate and may be composed of a single-crystalline semiconductor material or a compound semiconductor material. In some examples, silicon, germanium or glass may be used as a material of the substrate 500. A semiconductor layer 504 is formed on a surface 502 of the substrate 500 by using, for example, a deposition technique or an epitaxial technique. In some examples, the operation of providing the substrate 500 includes forming the semiconductor layer 504 from epitaxial silicon and/or epitaxial germanium. The semiconductor layer 504 has a first surface 506 and a second surface 508 opposite to each other. In some examples, a thickness of the semiconductor layer 504 ranges from 0.1 micrometers to 20 micrometers.

Figure 5B:
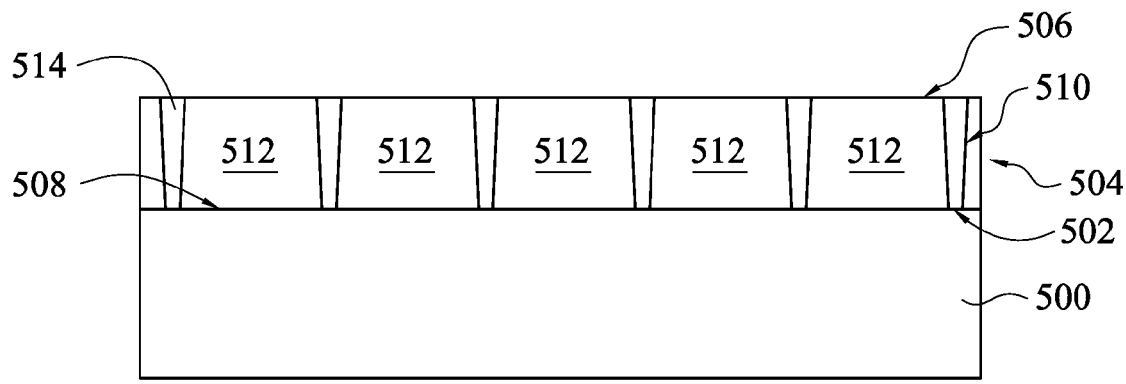

As shown in FIG. 5B, a grid shielding layer 514 is formed in the semiconductor layer 504 and extends from the first surface 506 toward the second surface 508 of the semiconductor layer 504, so as to define the semiconductor layer 504 into various pixel regions 512. The grid shielding layer 514 surrounds each of the pixel regions 512 to separate the pixel regions 512 from each other. In some examples, a depth of the grid shielding layer 514 is greater than two-thirds of the thickness of the semiconductor layer 504. In certain examples, the grid shielding layer 514 penetrates through the semiconductor layer 504, i.e. the grid shielding layer 514 extends from the first surface 506 to the second surface 508 of the semiconductor layer 504, and the depth of the grid shielding layer 514 is equal to the thickness of the semiconductor layer 504. In some examples, in the operation of forming the grid shielding layer 514, a trench 510 is formed in the semiconductor layer 504 using, for example, a photolithography process and an etching process. The trench 510 is formed to extend from the first surface 506 toward the second surface 508, so as to form the pixel regions 512 in the semiconductor layer 504. The operation of forming the trench 510 includes forming the trench 510 surrounding each of the pixel regions 512 and separating the pixel regions 512 from each other. In some examples, after the trench 510 is formed, the grid shielding layer 514 is formed to fill into the trench 510 by using a deposition technique, such as a CVD technique. A removal operation may be optionally performed to remove an excess portion of the grid shielding layer 514 on the first surface 506 of the semiconductor layer 504.

In some examples, the grid shielding layer 514 is formed from an electrically insulating material. In addition, the operation of forming the grid shielding layer 514 is performed to form the grid shielding layer 514 using a material having a refractive index which is smaller than that of the semiconductor layer 504. In some exemplary examples, the grid shielding layer 514 is formed from silicon dioxide, silicon nitride or silicon oxynitride while the semiconductor layer 504 is formed from epitaxial silicon.

Figure 5C:
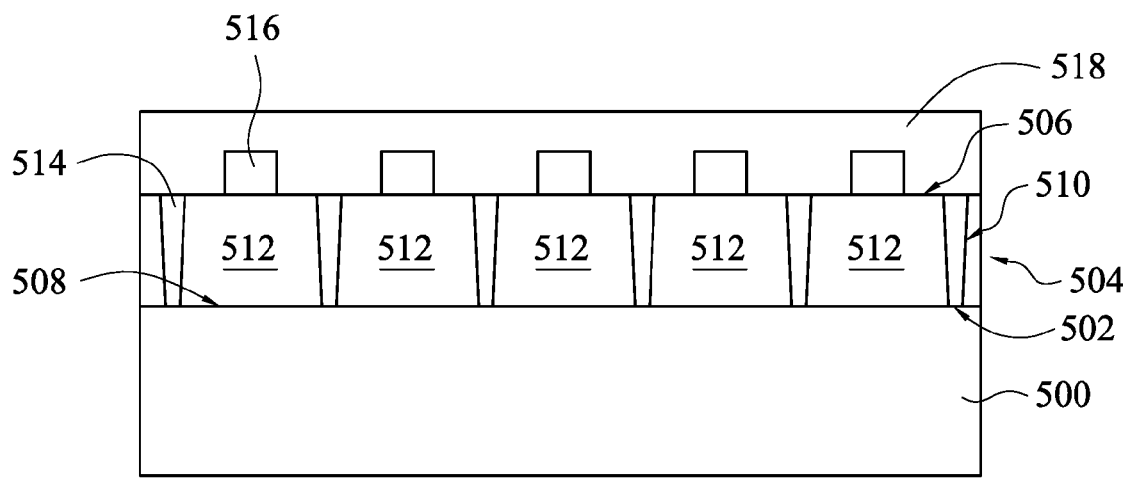

As shown in FIG. 5C, various light-sensing devices 516 are formed on the first surface 506 of the semiconductor layer 504 and are respectively disposed in the pixel regions 512. Thus, the grid shielding layer 514 separates the light-sensing devices 516 from each other. In some examples, each light-sensing device 516 includes an image sensor element, in which the image sensor element includes a photodiode and other elements.

In some examples, a passivation layer 518 is formed on the first surface 506 of the semiconductor layer 504 and covering the light-sensing devices 516, the grid shielding layer 514 and the first surface 506 of the semiconductor layer 504 for protecting the light-sensing devices 516, the grid shielding layer 514 and the semiconductor layer 504 from being damaged. The passivation layer 518 may be formed from silicon oxide, silicon nitride or silicon oxynitride. In some exemplary examples, the operation of forming the passivation layer 518 is performed using a deposition technique, such a CVD technique and a plasma enhanced CVD (PECVD) technique.

Figure 5D:
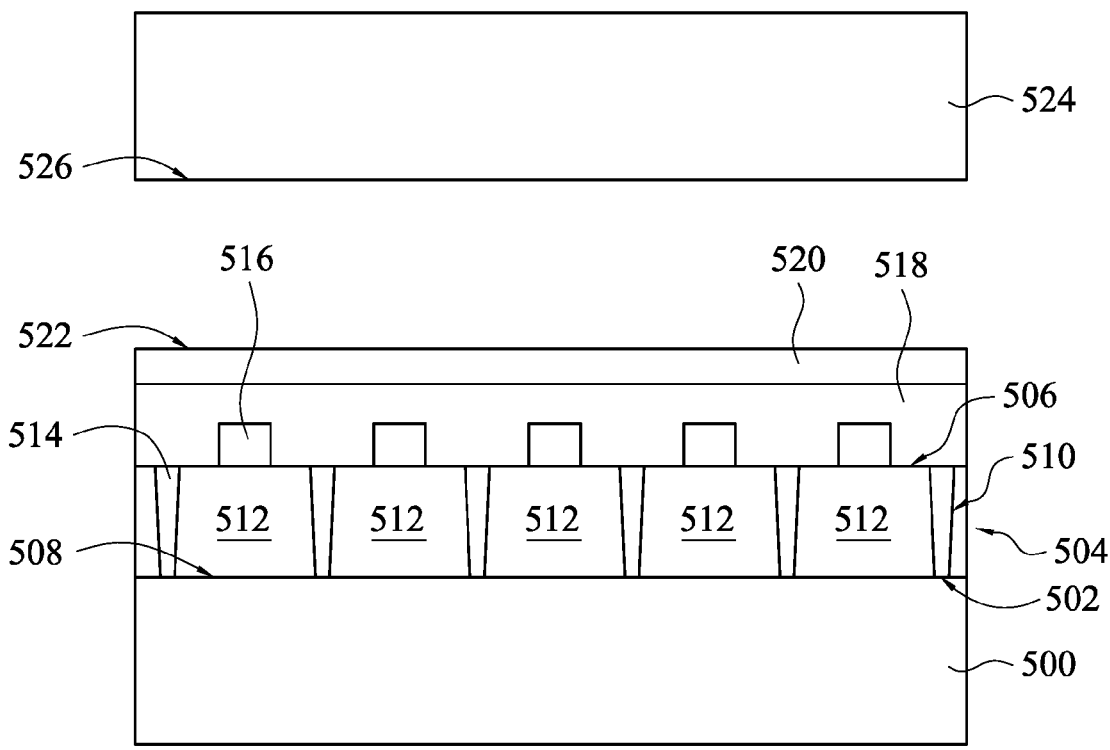

As shown in FIG. 5D, in some examples, another substrate 524 is provided and then is bonded to the passivation layer 518. In such examples, the passivation layer 518 may be formed from silicon dioxide. In addition, the substrate 524 is a semiconductor substrate and may be composed of a single-crystalline semiconductor material or a compound semiconductor material. For example, silicon, germanium or glass may be used as a material of the substrate 524. In certain examples, a bonding layer 520 is additionally formed on the passivation layer 518 between the operation of forming the passivation layer 518 and the operation of bonding the substrate 524. After the bonding layer 520 is formed, the substrate 524 is bonded to a surface 522 of the bonding layer 520. For example, the bonding layer 520 may be formed from silicon dioxide. In such examples, the passivation layer 518 may be formed from silicon oxide, silicon nitride or silicon oxynitride. With the bonding layer 520, a bonding effect of the operation of bonding the substrate 524 is enhanced.

Figure 5E:
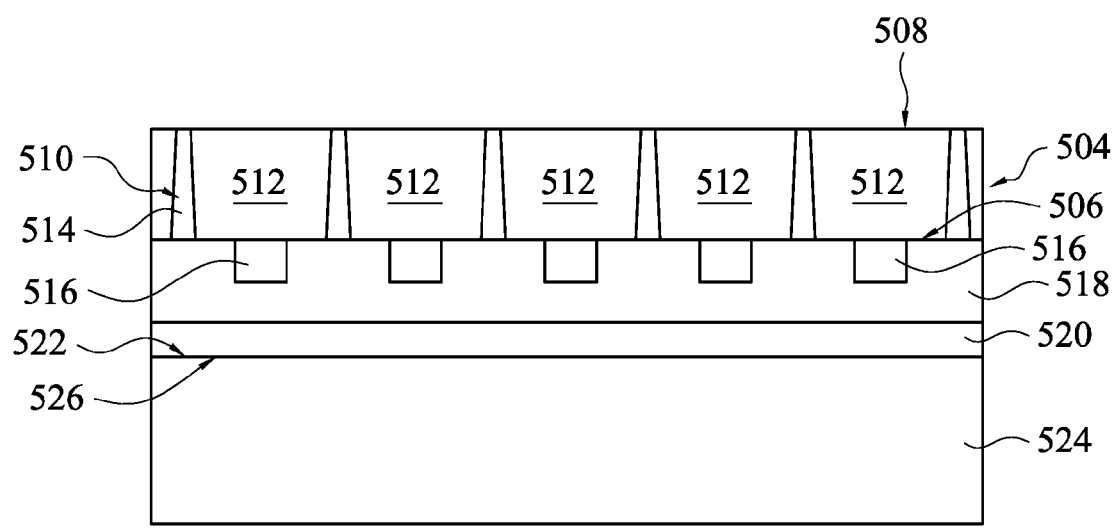

As shown in FIG. 5E, after the bonding operation is finished, the structure composed of the substrate 500, the semiconductor layer 504, the grid shielding layer 514, the light-sensing devices 516, the passivation layer 518, the bonding layer 520 and the substrate 524 is reversed, and the substrate 500 is removed to expose the second surface 508 of the semiconductor layer 504. In some examples, the operation of removing the substrate 500 is performed using a thinning technique, such as a wet etching technique and a CMP technique.

Figure 5F:
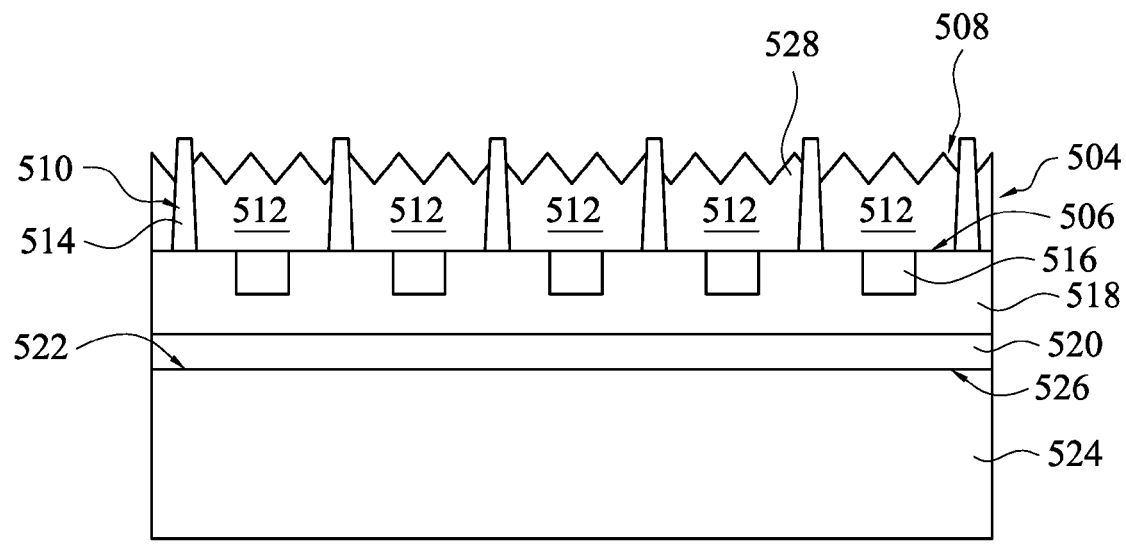

As shown in FIG. 5F, various microstructures 528 are formed on the second surface 508 of the semiconductor layer 504. In some examples, the operation of forming the microstructures 528 is performed using a photolithography process and an etching process. The photolithography process is performed to define regions where the microstructures 528 are formed, and the etching process is performed on the second surface 508 to remove a portion of the semiconductor layer 504 so as to form the microstructures 528 on the second surface 508 according to the definition of the photolithography process. In some exemplary examples, the operation of forming the microstructures 528 is similar to the operation of forming the microstructures 314 described above. In some examples, each microstructure 528 is formed with a cross-section in a shape of triangle, trapezoid or arc such as semi-circle or semi-ellipse. The microstructures 528 may be formed periodically or unperiodically. In addition, the operation of forming the microstructures 528 may be performed to form any two adjacent microstructures 528 adjoining to each other or being separated from each other.

Figure 5G:
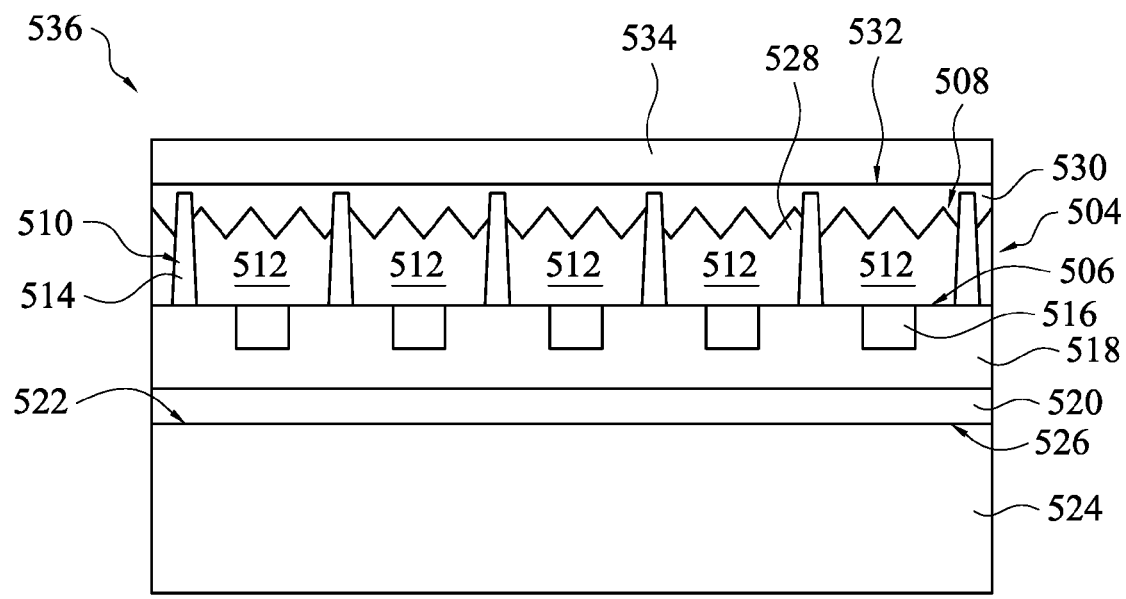

As shown in FIG. 5G, a transparent dielectric layer 530 is formed on the second surface 508 of the semiconductor layer 504 and covering the microstructures 528 to complete a semiconductor device 536. In some examples, in the operation of forming the transparent dielectric layer 530, the transparent dielectric layer 530 is firstly formed to cover the microstructures 528, and then a planarization operation is performed on the transparent dielectric layer 530 to planarize a surface 532 of the transparent dielectric layer 530. Thus, the surface 532 of the transparent dielectric layer 530 is planar after the planarization operation. In some exemplary examples, the operation of forming the transparent dielectric layer 530 is performed using a thermal oxidation technique or a CVD technique. In addition, the planarization operation is performed using a CMP technique. In some examples, the operation of forming the transparent dielectric layer 530 includes forming the transparent dielectric layer 530 using a material having a refractive index which is smaller than a refractive index of the semiconductor layer 504. For example, the operation of forming the transparent dielectric layer 530 includes forming the transparent dielectric layer 530 from silicon dioxide, silicon nitride or silicon oxynitride while the operation of the semiconductor layer 504 includes forming the semiconductor layer 504 from epitaxial silicon.

In some examples, after the operation of forming the transparent dielectric layer 530, a passivation layer 534 may be optionally formed on the surface 532 of the transparent dielectric layer 530 for protecting the transparent dielectric layer 530 from being damaged. The passivation layer 534 may be formed from silicon oxide, silicon nitride or silicon oxynitride.

Figure 6:
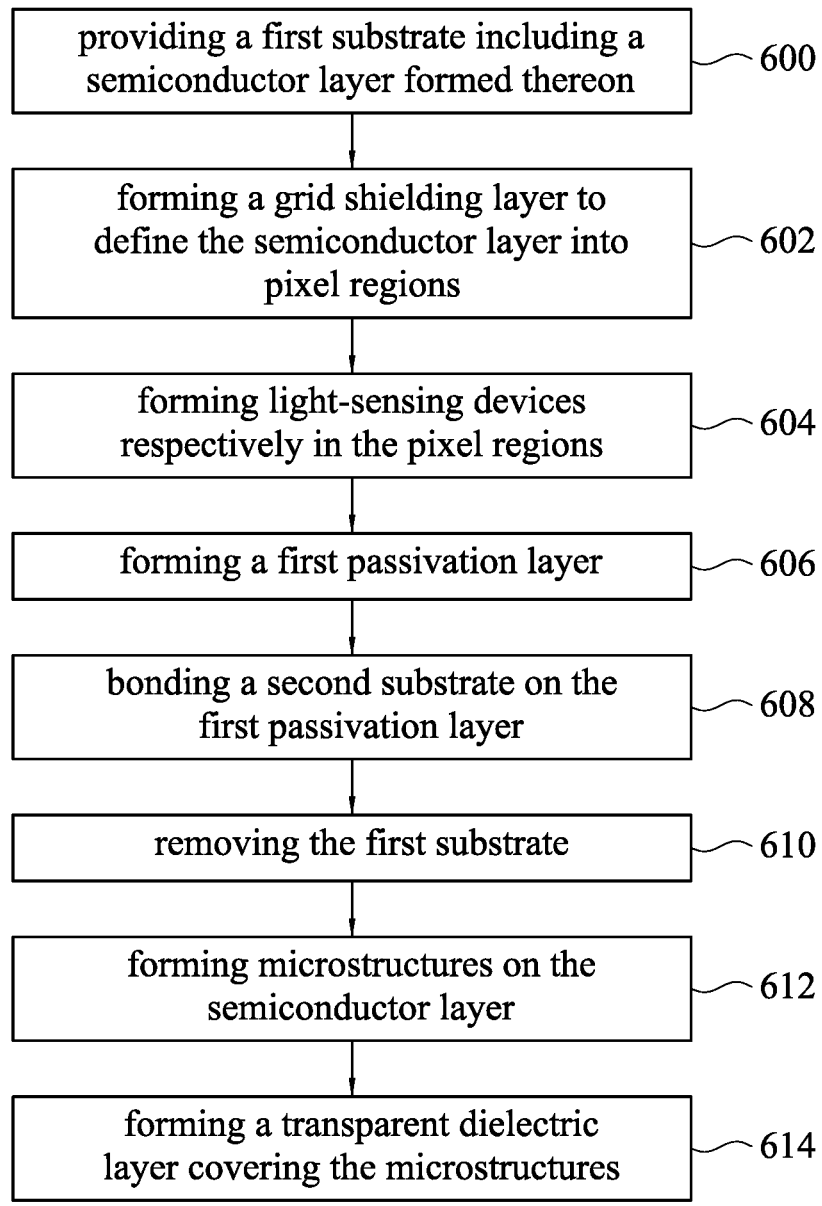
FIG. 6 is a flow chart of a method for manufacturing a semiconductor device in accordance with various embodiments.

Referring to FIG. 6 with FIG. 5A through FIG. 5G, FIG. 6 is a flow chart of a method for manufacturing a semiconductor device in accordance with various embodiments. The method begins at operation 600, where a substrate 500 is provided, and a semiconductor layer 504 is formed on a surface 502 of the substrate 500, as shown in FIG. 5A. The semiconductor layer 504 may be formed using, for example, a deposition technique or an epitaxial technique. The semiconductor layer 504 has a first surface 506 and a second surface 508 opposite to the first surface 506. In some examples, a thickness of the semiconductor layer 504 ranges from 0.1 micrometers to 20 micrometers.

At operation 602, as shown in FIG. 5B, a grid shielding layer 514 is formed in the semiconductor layer 504. In the operation of forming the grid shielding layer 514, a trench 510 is formed in the semiconductor layer 504 using, for example, a photolithography process and an etching process. The trench 510 is formed to extend from the first surface 506 toward the second surface 508 of the semiconductor layer 504, so as to define pixel regions 512 in the semiconductor layer 504. The operation of forming the trench 510 includes forming the trench 512 surrounding each of the pixel regions 512 and separating the pixel regions 512 from each other. Then, the grid shielding layer 514 is formed to fill into the trench 510 by using a deposition technique, such as a CVD technique. The trench 510 surrounds each of the pixel regions 512 and separates the pixel regions 512 from each other, so that the grid shielding layer 514 filling the trench 510 extends from the first surface 506 toward the second surface 508 and surrounds each of the pixel regions 512 to separate the pixel regions 512 from each other. In some examples, a depth of the grid shielding layer 514 is greater than two-thirds of the thickness of the semiconductor layer 504. In certain examples, the grid shielding layer 514 penetrates through the semiconductor layer 504, and the depth of the grid shielding layer 514 is equal to the thickness of the semiconductor layer 504. A removal operation may be optionally performed to remove an excess portion of the grid shielding layer 514 on the first surface 506 of the semiconductor layer 504.

In some examples, the grid shielding layer 514 is formed from an electrically insulating material. In some exemplary examples, the grid shielding layer 514 is formed using a material having a refractive index which is smaller than that of the semiconductor layer 504. For example, the grid shielding layer 514 is formed from silicon dioxide, silicon nitride or silicon oxynitride.

At operation 604, as shown in FIG. 5C, various light-sensing devices 516 are formed on the first surface 506 of the semiconductor layer 504 and are respectively disposed in the pixel regions 512. The grid shielding layer 514 separates the pixel regions 512, so that the grid shielding layer 514 separates the light-sensing devices 516 respectively in the pixel regions 512 from each other. At operation 606, referring to FIG. 5C again, a passivation layer 518 is formed on the first surface 506 of the semiconductor layer 504 and covering the light-sensing devices 516, the grid shielding layer 514 and the first surface 506 of the semiconductor layer 504 for protecting.

At operation 608, as shown in FIG. 5D, another substrate 524 is provided and then is bonded to the passivation layer 518. In such examples, the passivation layer 518 may be formed from silicon dioxide, and the substrate 524 may be formed form a semiconductor material, such as silicon, germanium and glass. In certain examples, a bonding layer 520 is additionally formed on the passivation layer 518 before the operation of bonding the substrate 524. Then, the substrate 524 is bonded to a surface 522 of the bonding layer 520. For example, the bonding layer 520 may be formed from silicon dioxide, and the passivation layer 518 may be formed from silicon oxide, silicon nitride or silicon oxynitride.

At operation 610, as shown in FIG. 5E, the structure composed of the substrate 500, the semiconductor layer 504, the grid shielding layer 514, the light-sensing devices 516, the passivation layer 518, the bonding layer 520 and the substrate 524 is reversed, and the substrate 500 is removed to expose the second surface 506 of the semiconductor layer 504 using, for example, a thinning technique. In some exemplary examples, the operation of removing the substrate 500 is performed using a wet etching technique and a chemical mechanical polishing technique.

At operation 612, as shown in FIG. 5F, various microstructures 528 are formed on the second surface 508 of the semiconductor layer 504 by using, for example, a photolithography process and an etching process. The operation of forming the microstructures 528 may be performed to form each microstructure 528 with a cross-section in a shape of triangle, trapezoid or arc such as semi-circle or semi-ellipse. The microstructures 528 may be formed periodically or unperiodically. In addition, the operation of forming the microstructures 528 may be performed to form any two adjacent microstructures 314 adjoining to each other or being separated from each other.

At operation 614, as shown in FIG. 5G, a transparent dielectric layer 530 is formed on the second surface 508 of the semiconductor layer 504, and covers the microstructures 528 by using, for example, a thermal oxidation technique or a chemical vapor deposition technique, so as to complete a semiconductor device 536. In some examples, a planarization operation may be optionally performed on the transparent dielectric layer 530 by using, for example, a CMP technique, so as to planarize a surface 532 of the transparent dielectric layer 530. The operation of forming the transparent dielectric layer 530 includes forming the transparent dielectric layer 530 using a material having a refractive index which is smaller than a refractive index of the semiconductor layer 504. In some exemplary examples, the operation of forming the transparent dielectric layer 530 includes forming the transparent dielectric layer 530 from silicon dioxide, silicon nitride or silicon oxynitride. Optionally, a passivation layer 534 may be formed to cover the surface 532 of the transparent dielectric layer 530 for protecting the transparent dielectric layer 530 from being damaged.

In accordance with an embodiment, the present disclosure discloses a semiconductor device. The semiconductor device includes a substrate, a semiconductor layer, light-sensing devices, a transparent dielectric layer and a grid shielding layer. The semiconductor layer is overlying the substrate and having a first surface and a second surface opposite to the first surface. The semiconductor layer includes microstructures on the second surface. The light-sensing devices are disposed on the first surface. The transparent dielectric layer is disposed on the second surface and covers the microstructures. The grid shielding layer extends from the first surface toward the second surface and surrounds each of the light-sensing devices to separate the light-sensing devices from each other, in which a depth of the grid shielding layer is greater than two-thirds of a thickness of the semiconductor layer.

In accordance with another embodiment, the present disclosure discloses a method for manufacturing a semiconductor device. In this method, a first substrate is provided, and a semiconductor layer is formed on a surface of the first substrate. The semiconductor layer has a first surface and a second surface opposite to the first surface. Microstructures are formed on the second surface. A transparent dielectric layer is formed on the second surface and covering the microstructures. A second substrate is bonded to the transparent dielectric layer. The first substrate is removed to expose the first surface. A grid shielding layer is formed to extend from the first surface toward the second surface to define the semiconductor layer into pixel regions, in which the grid shielding layer surrounds each of the pixel regions to separate the pixel regions from each other, and a depth of the grid shielding layer is greater than two-thirds of a thickness of the semiconductor layer. Light-sensing devices are respectively formed on the first surface in the pixel regions.

In accordance with yet another embodiment, the present disclosure discloses a method for manufacturing a semiconductor device. In this method, a first substrate is provided, and a semiconductor layer is formed on a surface of the first substrate. The semiconductor layer has a first surface and a second surface opposite to the first surface. A grid shielding layer is formed to extend from the first surface toward the second surface, so as to define the semiconductor layer into pixel regions, in which the grid shielding layer surrounds each of the pixel regions to separate the pixel regions from each other, and a depth of the grid shielding layer is greater than two-thirds of a thickness of the semiconductor layer. Light-sensing devices are respectively formed on the first surface in the pixel regions. A first passivation layer is formed to cover the light-sensing devices and the first surface. A second substrate is bonded on the first passivation layer. The first substrate is removed to expose the second surface. Microstructures are formed on the second surface. A transparent dielectric layer is formed on the second surface and covering the microstructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a semiconductor layer overlying the substrate and having a first surface and a second surface opposite to the first surface, wherein the semiconductor layer comprises a plurality of microstructures on the second surface;
   a plurality of light-sensing devices on the first surface;
   a transparent dielectric layer on the second surface and covering the microstructures; and
   a grid shielding layer extending from the first surface toward the second surface and surrounding each of the light-sensing devices to separate the light-sensing devices from each other, wherein a depth of the grid shielding layer is greater than two-thirds of a thickness of the semiconductor layer.

2. The semiconductor device of claim 1, wherein a refractive index of the semiconductor layer is greater than a refractive index of the transparent dielectric layer and a refractive index of the grid shielding layer.

3. The semiconductor device of claim 1, wherein the semiconductor layer is formed from epitaxial silicon, and each of the transparent dielectric layer and the grid shielding layer is formed from silicon dioxide, silicon nitride or silicon oxynitride.

4. The semiconductor device of claim 1, wherein the transparent dielectric layer is disposed between the semiconductor layer and the substrate.

5. The semiconductor device of claim 4, further comprising a passivation layer disposed on the semiconductor layer and covering the light-sensing devices.

6. The semiconductor device of claim 1, wherein the semiconductor layer is disposed between the transparent dielectric layer and the substrate.

7. The semiconductor device of claim 6, further comprising:
   a first passivation layer disposed on the transparent dielectric layer; and
   a second passivation layer disposed between the semiconductor layer and the substrate.

8. The semiconductor device of claim 7, further comprising a bonding layer disposed between the second passivation layer and the substrate.

9. The semiconductor device of claim 1, wherein the depth of the grid shielding layer is substantially equal to the thickness of the semiconductor layer.

10. A semiconductor device, comprising:
    a substrate;
    a semiconductor layer overlying the substrate and having a first surface and a second surface opposite to the first surface;
    a plurality of light-sensing devices on the first surface;
    a transparent dielectric layer on the second surface; and
    a grid shielding layer extending from the first surface toward the second surface and surrounding each of the light-sensing devices to separate the light-sensing devices from each other, wherein a depth of the grid shielding layer is greater than two-thirds of a thickness of the semiconductor layer.

11. The semiconductor device of claim 10, wherein a refractive index of the semiconductor layer is greater than a refractive index of the transparent dielectric layer and a refractive index of the grid shielding layer.

12. The semiconductor device of claim 10, wherein the semiconductor layer is formed from epitaxial silicon, and each of the transparent dielectric layer and the grid shielding layer is formed from silicon dioxide, silicon nitride or silicon oxynitride.

13. The semiconductor device of claim 10, wherein the transparent dielectric layer is disposed between the semiconductor layer and the substrate.

14. The semiconductor device of claim 13, further comprising a passivation layer disposed on the semiconductor layer and covering the light-sensing devices.

15. A semiconductor device, comprising:
a substrate;
a semiconductor layer overlying the substrate and having a first surface and a second surface opposite to the first surface;
a plurality of light-sensing devices on the first surface;
a first passivation layer disposed on the first surface and covering the light-sensing devices;
a bonding layer disposed between the substrate and the first passivation layer;
a transparent dielectric layer on the second surface; and
a grid shielding layer extending from the first surface toward the second surface and surrounding each of the light-sensing devices to separate the light-sensing devices from each other, wherein a depth of the grid shielding layer is greater than two-thirds of a thickness of the semiconductor layer.

16. The semiconductor device of claim 15, wherein a refractive index of the semiconductor layer is greater than a refractive index of the transparent dielectric layer and a refractive index of the grid shielding layer.

17. The semiconductor device of claim 15, wherein the semiconductor layer is formed from epitaxial silicon, and each of the transparent dielectric layer and the grid shielding layer is formed from silicon dioxide, silicon nitride or silicon oxynitride.

18. The semiconductor device of claim 15, further comprising a second passivation layer disposed on the transparent dielectric layer.

19. The semiconductor device of claim 15, wherein the depth of the grid shielding layer is substantially equal to the thickness of the semiconductor layer.

20. The semiconductor device of claim 15, wherein the semiconductor layer comprises a plurality of microstructures on the second surface.

* * * * *